(12) United States Patent
Yeh et al.

(10) Patent No.: US 6,287,896 B1
(45) Date of Patent: Sep. 11, 2001

(54) METHOD FOR MANUFACTURING LEAD FRAMES AND LEAD FRAME MATERIAL FOR SEMICONDUCTOR DEVICE

(75) Inventors: Shinn-Horng Yeh, Hsinchu Hsien; Shu-Chin Chou, Hsin-Chu Hsien; Ya-Ru Huang, Hsin-Chuang; Yu-Yu Lin, I-Lan Hsien, all of (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/396,494

(22) Filed: Sep. 13, 1999

(30) Foreign Application Priority Data

Apr. 28, 1999 (TW) .................................................. 88106810

(51) Int. Cl.[7] ............................ N01L 21/44; N01L 21/48; N01L 21/50
(52) U.S. Cl. ............................ 438/123; 438/106; 438/121
(58) Field of Search ..................................... 438/123, 106, 438/110, 121

(56) References Cited

U.S. PATENT DOCUMENTS 5,378,657 * 1/1995 Lin .

* cited by examiner

*Primary Examiner*—Kevin M. Picardat
*Assistant Examiner*—D. M. Collins
(74) *Attorney, Agent, or Firm*—W. Wayne Liauh

(57) ABSTRACT

The present invention is related to a method for manufacturing lead frames and a lead frame material including an intermediate layer and a top layer. The intermediate layer is composed of a layer of nickel-cobalt alloy having 5 to 30 wt. % of cobalt and a thickness of 3 to 20 microinches and a layer of nickel or nickel alloy having a thickness of 10 to 80 microinches. The intermediate layer can inhibit the diffusion of the base metal to the surface of the leads. The top layer consisting of gold or gold alloy, which is composed of gold and at least one metal selected from the group consisting of palladium, silver, tin and copper and has at least 60 weight percent gold, has a thickness of 0.1 to 5 microinches.

11 Claims, 4 Drawing Sheets

METHOD FOR MANUFACTURING LEAD FRAMES AND LEAD FRAME MATERIAL FOR SEMICONDUCTOR DEVICE

BACKGROUND OF THE INVENTION

1. Field of the Invention

The present invention is related to a method for manufacturing lead frames and a lead frame material including an intermediate layer and a top layer for improving the reliability of wire bonding such as anti-corrosion, anti-oxidation, solderability, and less bending cracking in the semiconductor device.

2. Related Art

One of the popular approaches to electrically interconnect an IC unit to circuitry external of the IC device takes the form of a lead frame made of copper or copper alloy. The lead frame includes die pads on which semiconductor chips are fixed. The inner leads are connected to semiconductor chips and outer leads are connected to printed circuit board. However, the surface of the lead frame is easily oxidized by contact with air. The oxidation of lead frame will cause a drop in bonding strength between the inner lead and the bonding wires which connect bonding pads of the semiconductor chips to the corresponding inner leads of the lead frames. Conventional means for preventing the drop in bonding strength by the oxidation is to form a layer of SnPb or Ag on the surface of lead frames.

A pre-plated frame (PPF) is another technique to avoid the oxidation of copper in air. In this technique, the copper base is blanket plated with a protective coating over the surface of the lead frame before package fabrication. The protective coating should meet the requirements of reliability such as good solderability and non-cracking.

The blanket frames are typically plated with a layer of nickel (Ni) over the surface of the lead frames to form a protective coating. Nickel plating was intended to serve as a barrier against the the diffusion of copper atoms and prohibit formation of copper oxides on the surface of the lead frame. Furthermore, a solder layer of palladium (Pd) was formed by deposited a palladium or palladium/nickel alloy on top of the nickel layer in order to enhance solderability of the outer lead, as disclosed in U.S. Pat. Nos. 5,436,082, 5,454,929, 5,486,721, European Patent Application No. 0335608 and European Patent Application No. 0384586.

Unfortunately, the nickel layer in thickness of less than 40 microinches contains pores through which migration and diffusion of copper to the surface of the lead frame takes place. However, the nickel layer in thickness of greater than 40 microinches tends to crack when the lead are eventually bent. An attempt to reduce effects of diffusion of copper through a less than 40 microinches thick nickel layer was made by successively deposited a nickel layer, a layer of palladium or soft gold (Au) strike, a layer of palladium-nickel alloy, a layer of palladium and a layer of gold as disclosed in U.S. Pat. No. 5,360,991. However, the manufacturing process of in succession from the five-layered-structure (Au/Pd/Pd—Ni/Ni or Au strike/Ni/lead frame) is quite complicated and hard processed.

In recent years, the price of palladium is almost as that of gold; therefore, the conventional pre-plated frame with a solder layer of palladium has a drawback in that the manufacturing cost thereof is high.

SUMMARY OF THE INVENTION

The present invention is directed toward resolving the above problems. Namely, an object of the present invention is to provide lead frame having high reliability for wire bonding. The protective coating of the lead frame avoid the oxidation of the copper base and can be easily facilitated by soldering without bending or cracking. Meanwhile, the process steps are not complicated. The lead frame can be produced with a low manufacturing cost.

Accordingly, the present invention provides a method for manufacturing lead frames comprising the steps of: providing a base plate, forming a intermediate layer on the base plate, and forming a top layer on the intermediate layer. The intermediate layer is composed of a layer of nickel-cobalt alloy and a layer of nickel or nickel alloy and the intermediate layer in a thickness sufficient to inhibit further diffusion of the base metal to the surface of the leads. The top layer consisting of gold or gold alloy.

In order to accomplish this object, lead frame material of the present invention comprising the copper or copper alloy base plate. The layer of nickel-cobalt alloy formed on the base plate, wherein the layer of nickel-cobalt alloy has 5 to 30 weight percent cobalt and a thickness of 3 to 20 microinches. The layer of nickel or nickel alloy formed on the layer of nickel-cobalt alloy, wherein the layer of nickel alloy has less than 15 weight percent phosphorus or boron, the layer of nickel or nickel alloy has a thickness of 10 to 80 microinches. The layer of gold or gold alloy formed on the layer of nickel or nickel alloy, wherein the layer of gold alloy is composed of gold and at least one metal selected from the group consisting of palladium, silver, tin and copper, the layer of gold alloy has at least 60 weight percent gold and the layer of gold or gold alloy has a thickness of 0.1 to 5 microinches.

A semiconductor device package is also provided according to object of the present invention comprising at least one semiconductor device; and lead frames sealed within a protective package in which the lead frame including a device mounting pad and lead frame leads to be bonded to the semiconductor device. The lead frame is consisting of: a base plate, a layer of nickel-cobalt alloy having 5 to 30 wt. % of cobalt (preferably 5 to 20 wt. %) and a thickness of 3 to 20 microinches (preferably 3 to 7 microinches), a layer of nickel or nickel alloy, which is a nickel-phosphorus or nickel-boron alloy with phosphorus or boron content less than 15 wt. %. (preferably 8 to 12 wt. %), has a thickness of 10 to 80 microinches (preferably 10 to 20 microninches)., and a layer of gold or gold alloy, which is composed of gold and at least one metal selected from the group consisting of palladium, silver, tin and copper and has at least 60 weight percent gold, has a thickness of 0.1 to 5 microinches (preferably 0.4 to 1 microninches).

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow illustration only, and thus are not limitative of the present invention, and wherein.

DETAILED DESCRIPTION OF THE INVENTION

Figure 1:
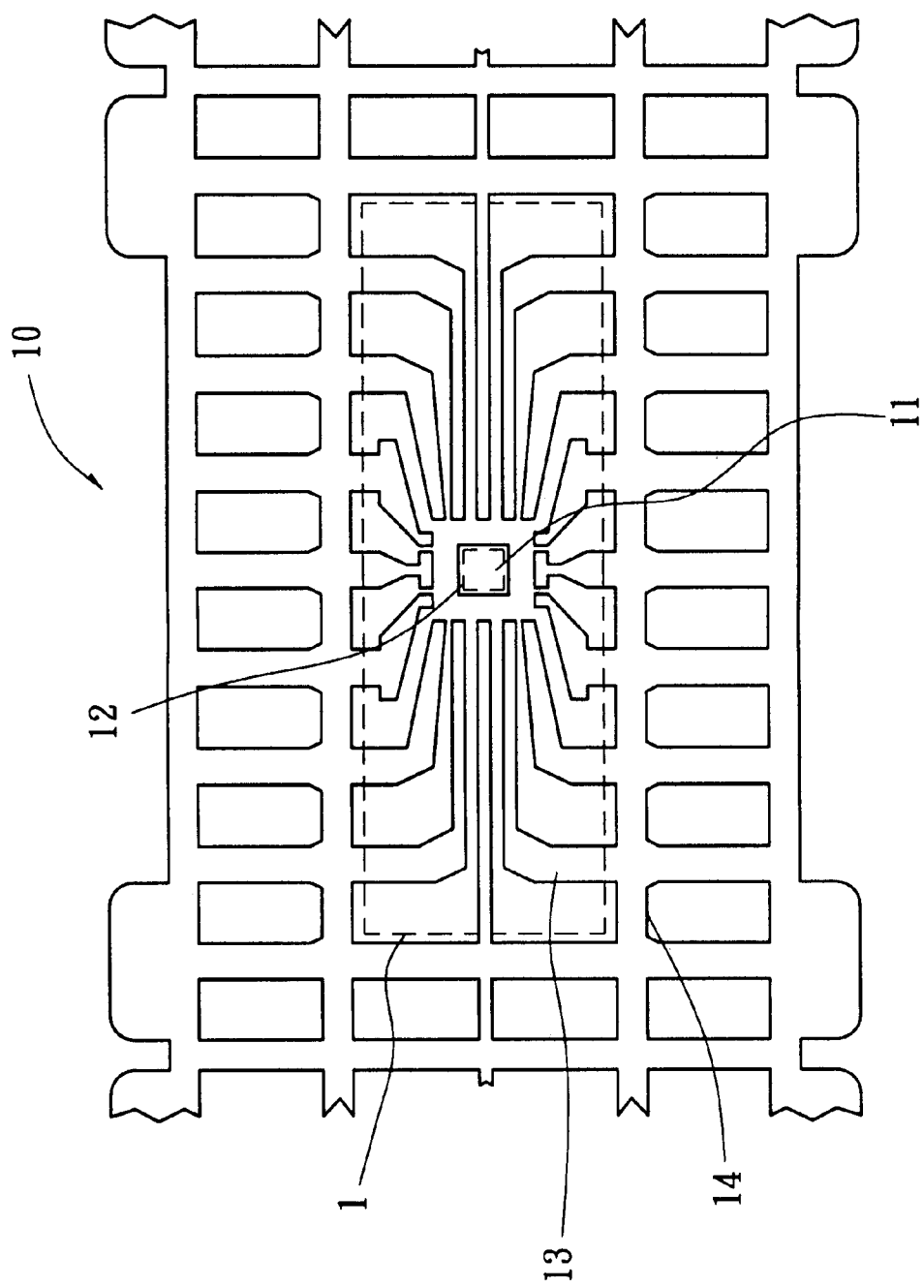
FIG. 1 is a schematic representation of a top view of a typical lead frame for with an IC unit.

FIG. 1 illustrates a top view of a typical lead frame 10 for use with an integrated circuit (IC) unit 11. The lead frame includes a paddle 12 on which the IC unit is bonded, and leads 13. Dam bars 14 which interconnect leads 12 at this stage, and trimmed away after a packaging medium has been applied over an area shown in phantom lines 1.

Figure 2:
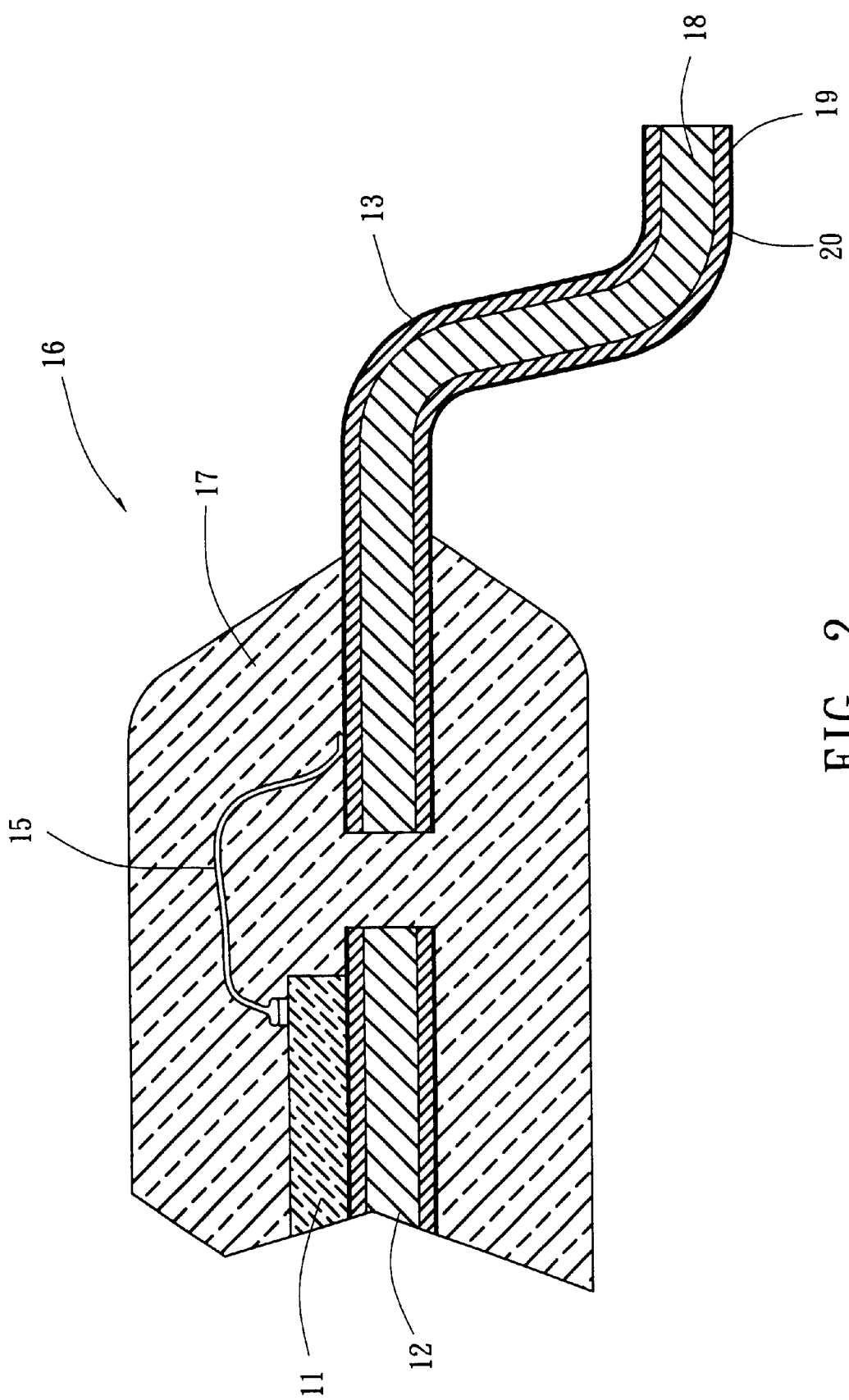
FIG. 2 is a schematic cross-section side view of a package according to the present invention.

In FIG. 2 is shown a schematic cross-section side view of a package 16. The package 16 includes IC unit 11, paddle 12, and leads 13. The IC unit 11 which is bonded on the paddle 12 by solder or adhesive is electrically connected via wires 15, to the leads 13. IC unit 11, paddle 12, wires 15 and portions of the leads 13 adjacent to the paddle 12 are enclosed in a molded packaging medium 17. The leads 13 includes a base plate 18, a intermediate layer 19 on the base plate 18, and a top layer 20 on the intermediate layer 19.

Figure 3:
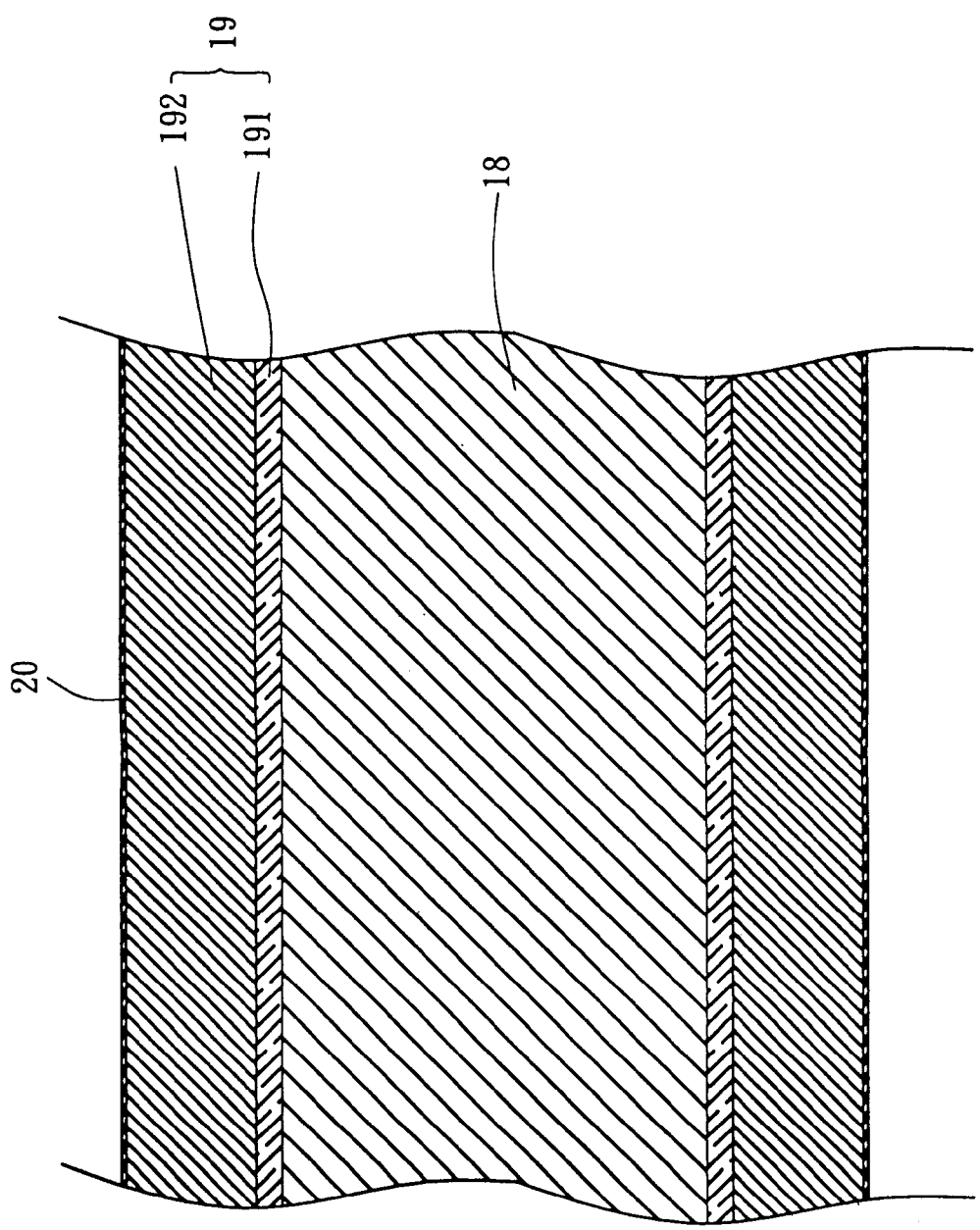
FIG. 3 is an enlarged schematic representation of a cross-section of a portion of leads according to the present invention.

FIG. 3 shows an enlarged schematic representation of a cross-section of a portion of leads 13. The base plate 18 is typically composed of copper or copper alloy. Copper alloy NO. 194 (97.5 Cu, 2.35 Fe, 0.003 P, 0.12 Zn) is representative of the materials being used for the lead frames. Other alloys, such as iron-nickel alloys may also be used as the base metal.

The intermediate layer 19 formed on the base plate 18 consists of a layer of nickel-cobalt alloy 191 and a layer of nickel or nickel alloy 192. The layer of nickel-cobalt alloy 192 has 5 to 30 wt. % of cobalt (preferably 5 to 20 wt. %) and a thickness of 3 to 20 microinches (preferably 3 to 7 microinches). The layer of nickel alloy 192 has a thickness of 10 to 80 microinches (preferably 10 to 20 microinches). The nickel alloy is a nickel-phosphorus or nickel-boron alloy with phosphorus or boron content less than 15 wt. %. The higher the phosphorus content in the nickel-phosphorus alloy layer, the greater strength of wire bond. However, The phosphorus content ratio of nickel-phosphorus alloy is preferable ranging from 8 to 12 wt. %.

The above layer of nickel-cobalt alloy 191 is a fine grained layer and effectively deposited over the surface of the base plate 18. The layer of nickel-cobalt alloy 191 can reduce effects of porosity and prevent diffusion of copper from base plate 18 to the surface which is used for soldering. The thick layer of nickel-cobalt alloy 191 tends to crack when the leads 13 are eventually bent. A layer of nickel or nickel alloy 192 is deposited to overcome this shortcoming. This layer of nickel or nickel alloy 192 consists of laminar structure. The surface of laminar structure is smoother than column nickel which contributes to an enhancement in step coverage of subsequent growth of the top layer 20 with reduced porosity.

Figure 4:
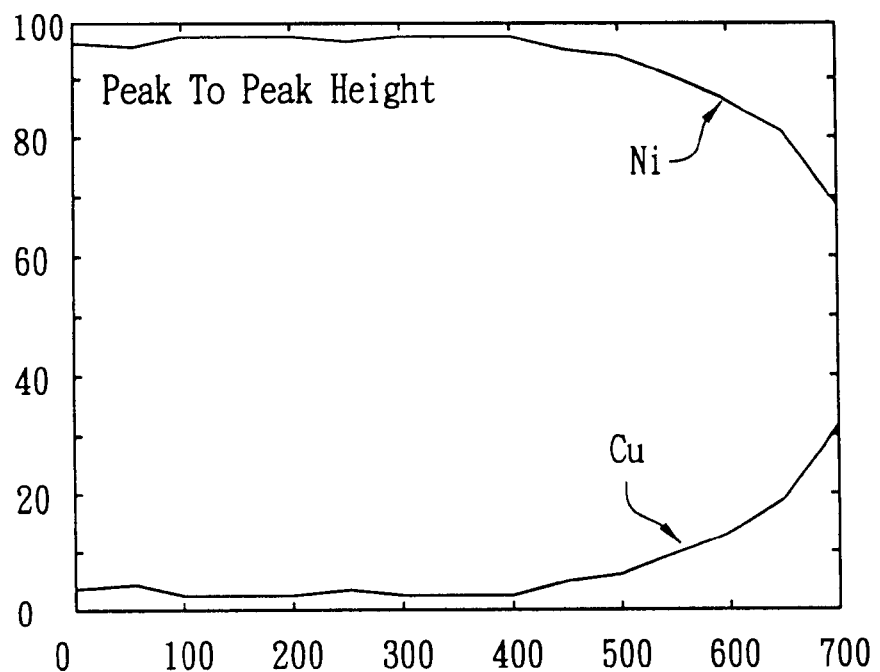
FIG. 4 is a plot of an Auger depth profile analysis of the layer of nickel-cobalt alloy of the present invention.
Figure 5:
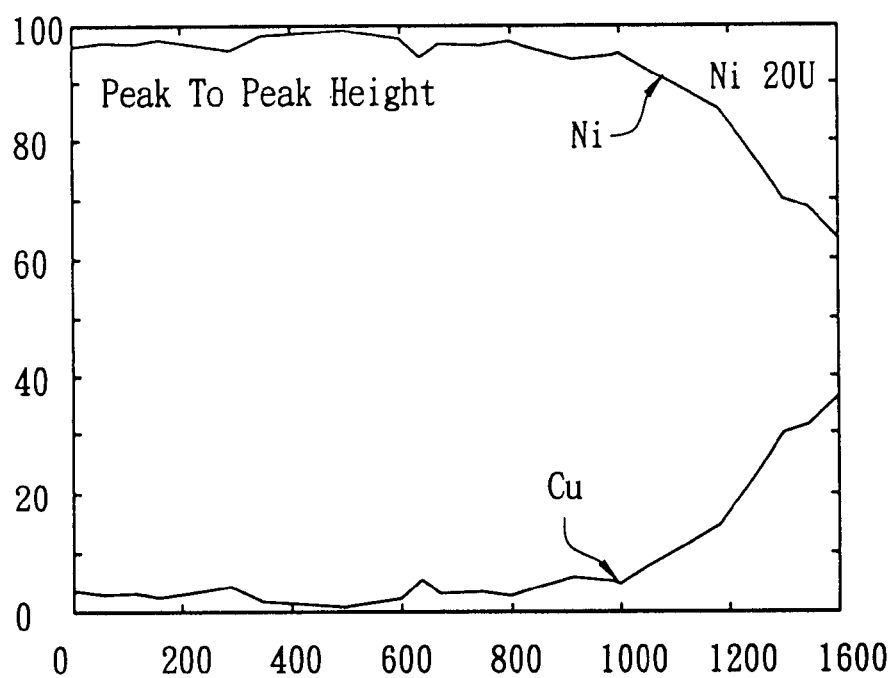
FIG. 5 is a plot of an Auger depth profile analysis of the nickel layer of the present invention.

In FIGS. 4 and 5 are shown plots of an Auger depth profile analysis of the layer of nickel-cobalt alloy and the nickel layer. The 20 microninches-thick samples was subjected to a thermal heat treatment at 250° C., for 4 hours. It is seen from FIG. 4 that no copper is detected in the nickel layer for a period of about 400 to 500 seconds. In comparison, FIG. 5 reveals that copper diffused from the base plate into the layer of nickel-cobalt alloy is detected for a period of 1000 to 1200 seconds. The layer of nickel-cobalt alloy has better preventing ability of copper penetration than the pure nickel layer.

The top layer 20 formed on the intermediate layer 19 as shown in FIG. 3 is composed of gold or gold alloy. The top layer 20 has a thickness of 0.1 to 5 microinches (preferably 0.4 to 1 microninches). The top layer 20 protects lead frame from oxidation or corrosion and improves the reliability of soldering of outer leads. The top layer 20 is composed of gold or gold alloy. The gold alloy consists of gold and at least one metal selected from the group consisting of palladium, silver, tin and copper which has good solderability of SnPb and is suitable to be soldered. The preferable gold content in gold alloy is at least 60 wt. %.

A comparison is made between the lead frame materials of the present invention and the lead frame materials of prior art. The metal coating of prior art is composed of a 5 microninches-thick nickel-cobalt layer, a 15 microninches-thick layered-nickel or nickel-phosphorus layer, a 0.8 microninches-thick gold or glod alloy, 40 microninches-thick column nickel layer and a 3 microninches-thick palladium layer. The coating solutions of the above-mentioned lead frame materials are listed as follows:

a) Coating solution of Ni—Co alloy contains Ni (80 g/l), Co (3.5 g/l) and additive (a bit).

b) Coating solution of Ni contains Ni (80 g/l), $NiCl_2$ (3.5 g/l), $H_3BO_3$(40 g/l) and additive (a bit).

c) Coating solution of Ni—P alloy contains Ni (80 g/l), $H_3PO_3$ (40 g/l), $NiCl_2$(3.5 g/l), $H_3BO_3$ (20 g/l) and additive (a bit).

d) Coating solution of Au—Pd alloy contains Au (2 g/l), Pd (0.08 g/l), $Na_2HPO_4$ (20 g/l) and additive (a bit).

e) Coating solution of Au—Cu alloy contains Au (2 g/l), Cu (0.1 g/l), $H_3PO_4$ (25 g/l) and additive (a bit).

f) Coating solution of Au—Sn alloy contains Au (2 g/l), Sn (0.2 g/l), $K_4P_2O_7$ (150 g/l) and additive (a bit).

To determine whether or not the surface of the lead frame would be suitable for a reliable connection, the lead frames are subjected to the following reliability tests.

a) Solderability: Military Standard 883D, Method 2022.2. is used as a qualifying criterion. Coatings to be solderability acceptable must have To less than 0.59 seconds.

b) Porosity: The lead frame immerses in copper-strip solution which is a amine type at room temperature for 1 hour. The concentration of copper ions in the solution is detected by UV light after immersion.

c) Bondability: The gold wires of 1 mil are subjected to destructive pull test. The bondability acceptable must have stretchability greater than 6 grams.

The solderability, porosity and bondability performance results of the lead frame materials of the present invention and the lead frame materials of prior art are presented in Table I to V.

The multi-layers including Ni—Co alloy/laminar Ni/Cu base plate in Table I has a thickness of about 20 microninches which more prevents diffusion of copper than the Ni layer with a thickness of 40 microninches. The prevention ability of copper diffusion of the multi-layers including Ni—Co alloy/laminar Ni/Cu base plate is better than the multi-layers including laminar Ni/Ni—Co alloy/Cu base plate due to the good step-coverage of Ni—Co alloy layer.

TABLE I

| Composition of layers | Porosity ([Cu$^{2+}$]/mgcm$^{-2}$) | |
| --- | --- | --- |
| | Before bending | After bending |
| Ni—Co/laminar Ni/Cu base plate (20 μin) | 0.024 ± 0.004 | 0.051 ± 0.007 |
| laminar Ni/Ni—Co/Cu base plate (20 μin) | 0.017 ± 0.007 | 0.039 ± 0.009 |
| Ni/Cu base plate (prior art) (20 μin) | 0.03 ± 0.002 | 0.079 ± 0.01 |

The solubility of gold, tin and copper in the SnPb solution are good. The application of gold-copper alloy and gold-tin alloy is to further reduce oxidation of copper and tin which is acceptable for soldering.

TABLE II

| Composition of layers | solderability (To/sec) |
| --- | --- |
| Au—Cu/laminar Ni/Ni—Co/Cu base plate | 0.34 ± 0.05 |
| Au—Sn/laminar Ni/Ni—Co/Cu base plate | 0.29 ± 0.06 |

The solderability of the multi-layers including Au/laminar Ni/Ni—Co alloy/Cu base plate is almost the same of prior art (Pd/Ni/Cu base plate) as illustrated in Table III. In Table IV, the bondability of multi-layers including Au—Pd/Ni—P/Ni—Co/Cu base plate is almost the same of prior art (Pd/Ni/Cu base plate) too.

TABLE III

| Composition of layers | solderability (To/sec) |
| --- | --- |
| Au/laminar Ni/Ni—Co/Cu base plate | 0.25 ± 0.06 |
| Pd/Ni/Cu base plate | 0.3 ± 0.04 |

TABLE IV

| Composition of layers | bondability (g) |
| --- | --- |
| Au—Pd/Ni—P/Ni—Co/Cu base plate | 6.7 ± 0.6 |
| Pd/Ni/Cu base plate | 7.1 ± 0.8 |

The solderability and porosity testing of lead frame are conducted under the temperature of plastic molded packaging. The multi-layers including Au—Pd/laminar Ni/Ni—Co/Cu base plate has solderability smaller than 0.59 sec and porosity smaller than 0.03 [Cu$^{2+}$]/mgcm$^{-2}$. Both the solderability and porosity are acceptable for soldering.

TABLE V

| Au—Pd /laminar Ni/Ni—Co/Cu base plate | solderability (To/sec) | porosity ([Cu$^{2+}$]/mgcm$^{-2}$) | |
| --- | --- | --- | --- |
| | | Before bending | After bending |
| After deposited | 0.25 ± 0.05 | 0.008 ± 0.004 | 0.015 ± 0.007 |
| Baking at 175° C. for 16 hours | 0.32 ± 0.09 | 0.015 ± 0.006 | 0.021 ± 0.01 |
| Steam treatment for 16 hours | 0.34 ± 0.11 | 0.018 ± 0.007 | 0.025 ± 0.011 |

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for manufacturing lead frames, comprising the steps of:
    providing a base plate formed of a base metal;
    forming an intermediate layer on said base plate, wherein said intermediate layer is composed of a layer of nickel-cobalt alloy and a layer of nickel or nickel alloy and said intermediate layer has a thickness sufficient to inhibit diffusion of said base metal to reach a surface of a lead frame to be manufactured; and
    forming a top layer on said intermediate layer, said top layer consisting of gold or gold alloy.

2. The lead frame of claim 1, wherein said layer of nickel-cobalt-alloy has 5 to 30 weight percent cobalt and a thickness of 3 to 20 microinches, said layer of nickel or nickel alloy has a thickness of 10 to 80 microinches and said top layer has a thickness of 0.1 to 5 microinches.

3. The lead frame of claim 2, wherein said layer of nickel-cobalt alloy has 5 to 20 weight percent cobalt and a thickness of 3 to 7 microinches.

4. The lead frame of claim 2, wherein said layer of nickel or nickel alloy has a thickness of 10 to 20 microinches.

5. The lead frame of claim 2, wherein said top layer has a thickness of 0.4 to 1 microinches.

6. The lead frame of claim 1, wherein said layer of nickel alloy is composed of nickel-phosphorus or nickel-boron alloy including less than 15 weight percent phosphorus or boron.

7. The lead frame of claim 6, wherein said nickel-phosphorus or nickel-boron alloy having 8 to 12 weight percent phosphorus or boron.

8. The lead frame of claim 1, wherein said layer of gold alloy is composed of gold and at least one metal selected from the group consisting of palladium, silver, tin and copper.

9. The lead frame of claim 1, wherein said intermediate layer including in succession from the layer of nickel-cobalt alloy and the layer of nickel or nickel alloy.

10. The lead frame of claim 1, wherein said intermediate layer including in succession from the layer of nickel or nickel alloy and the layer of nickel-cobalt alloy.

11. The lead frame of claim 1, wherein said nickel is laminar nickel.

* * * * *